United States Patent
Gao

(10) Patent No.: US 10,811,113 B2
(45) Date of Patent: Oct. 20, 2020

(54) ELECTRICALLY PROGRAMMABLE FUSE CIRCUIT, PROGRAMMING METHOD FOR ELECTRICALLY PROGRAMMABLE FUSE, AND STATE DETECTION METHOD FOR ELECTRICALLY PROGRAMMABLE FUSE

(71) Applicant: Shanghai Huahong Grace Semiconductor Manufacturing Corporation, Shanghai (CN)

(72) Inventor: Chao Gao, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 16/423,923

(22) Filed: May 28, 2019

(65) Prior Publication Data
US 2020/0160926 A1 May 21, 2020

(30) Foreign Application Priority Data
Nov. 21, 2018 (CN) .......................... 2018 1 1392950

(51) Int. Cl.
*G11C 17/16* (2006.01)
*G11C 17/18* (2006.01)
(Continued)

(52) U.S. Cl.
CPC .............. *G11C 17/16* (2013.01); *G11C 17/18* (2013.01); *H01L 23/5256* (2013.01); *H01L 27/11206* (2013.01)

(58) Field of Classification Search
CPC ..... G11C 17/16; G11C 17/18; H01L 23/5256; H01L 27/11206
(Continued)

(56) References Cited

U.S. PATENT DOCUMENTS 5,966,339 A 10/1999 Hsu et al.
6,327,211 B1* 12/2001 Kai .................... G11C 16/06
365/189.15
(Continued)

FOREIGN PATENT DOCUMENTS

| CN | 1349259 A | 5/2002 |
|----|-----------|--------|
| CN | 1604233 A | 4/2005 |

(Continued)

OTHER PUBLICATIONS

First Chinese Office Action regarding Application No. 201811392950.8 dated Mar. 26, 2020. English translation provided by Unitalen Attorneys at Law.

*Primary Examiner* — Connie C Yoha
(74) *Attorney, Agent, or Firm* — Harness, Dickey & Pierce, P.L.C.

(57) ABSTRACT

An electrically programmable fuse circuit, a programming method for electrically programmable fuse, and a state detection method for electrically programmable fuse are provided. The electrically programmable fuse circuit includes a plurality of fuse cells connected in series, wherein in each of the plurality of fuse cells, one terminal of the fuse cell is connected with a first programming terminal corresponding to the fuse cell, and the other terminal of the fuse cell is connected with a second programming terminal corresponding to the fuse cell via a transistor. Reliability of electrically programmable fuses may be improved.

15 Claims, 7 Drawing Sheets

(51) Int. Cl.
*H01L 23/525* (2006.01)
*H01L 27/112* (2006.01)

(58) Field of Classification Search
USPC ............ 365/230.06, 230.08, 185.21, 185.22, 365/185.23, 185.25
See application file for complete search history.

(56) References Cited

U.S. PATENT DOCUMENTS

| | | | |
|---|---|---|---|
| 6,838,926 | B2 | 1/2005 | Jung et al. |
| 7,002,829 | B2 | 2/2006 | Singh et al. |
| 7,528,646 | B2 | 5/2009 | Aipperspach et al. |
| 7,529,147 | B2 | 5/2009 | Ueda |
| 7,532,057 | B2 | 5/2009 | Aipperspach et al. |
| 7,538,597 | B2 | 5/2009 | Kwong et al. |
| 7,567,114 | B2 * | 7/2009 | Matsubara ............ G11C 17/16 327/525 |
| 7,835,211 | B2 | 11/2010 | Ueda |
| 8,213,211 | B2 | 7/2012 | Kurjanowicz |
| 9,747,999 | B2 | 8/2017 | Yang |
| 9,984,762 | B1 | 5/2018 | Seshasayee et al. |
| 2002/0044006 | A1 | 4/2002 | Jung et al. |
| 2003/0213953 | A1 * | 11/2003 | Sohn ....................... H01L 22/32 257/48 |
| 2005/0070052 | A1 | 3/2005 | Singh et al. |
| 2007/0108550 | A1 | 5/2007 | Ueda |
| 2008/0068910 | A1 | 3/2008 | Jao |
| 2008/0106323 | A1 | 5/2008 | Aipperspach et al. |
| 2008/0157851 | A1 | 7/2008 | Aipperspach et al. |
| 2009/0045867 | A1 | 2/2009 | Kwong et al. |
| 2009/0174029 | A1 | 7/2009 | Ueda |
| 2010/0202183 | A1 | 8/2010 | Kurjanowicz |
| 2011/0317468 | A1 * | 12/2011 | Terzioglu ............... G11C 17/18 365/96 |
| 2017/0186495 | A1 | 6/2017 | Yang |

FOREIGN PATENT DOCUMENTS

| | | |
|---|---|---|
| CN | 1964047 A | 5/2007 |
| CN | 101165888 A | 4/2008 |
| CN | 101611455 A | 12/2009 |
| CN | 102308338 A | 1/2012 |
| CN | 105575436 A | 5/2016 |
| CN | 106910525 A | 6/2017 |
| CN | 108615718 A | 10/2018 |

* cited by examiner

ELECTRICALLY PROGRAMMABLE FUSE CIRCUIT, PROGRAMMING METHOD FOR ELECTRICALLY PROGRAMMABLE FUSE, AND STATE DETECTION METHOD FOR ELECTRICALLY PROGRAMMABLE FUSE

CROSS-REFERENCE TO RELATED APPLICATIONS

This application claims the benefit of priority to Chinese Patent Application No. 201811392950.8, filed on Nov. 21, 2018, the entire disclosure of which is incorporated herein by reference.

TECHNICAL FIELD

The present disclosure generally relates to an integrated circuit field, and more particularly, to an electrically programmable fuse circuit, a programming method for electrically programmable fuse, and a state detection method for electrically programmable fuse.

BACKGROUND

As semiconductor processes become miniaturized and more complicated, semiconductor components are more susceptible to various defects or impurities. Failure of a single wire, a diode or a transistor can cause defects in an entire chip. To solve the problem, some fuses are formed in an integrated circuit to ensure availability of the integrated circuit.

In existing techniques, an Electrically Programmable Fuse (eFuse) is a component commonly used in a semiconductor integrated circuit. The eFuse can also be referred to as an electrically programmable silicide polysilicon fuse, for example, a polysilicon fuse (Poly Fuse) using Electro Migration (EM) feature for programming. The electrically programmable fuse is fully compatible with a logic Complementary Metal Oxide Semiconductor (CMOS) process, simple to operate, small in size, and capable of providing greater flexibility.

In the existing techniques, an electrically programmable fuse circuit generally includes a fuse cell which may include a semiconductor substrate, a polysilicon structure and a metal silicide. Generally, a first terminal of the fuse cell is coupled with an anode of a power supply, and a second terminal of the fuse cell is coupled with a cathode of the power supply. During fusing of the electrically programmable fuse, the metal silicide between the first and second terminals of the fuse cell is fused via an input current, so as to cut off a current between the first and second terminals to complete programming.

However, a test of the electrically programmable fuse is usually the last step in a chip probe. Once the electrically programmable fuse fails, the chip probe will fail and the yield of chips will be reduced.

SUMMARY

By embodiments of the present disclosure, reliability of electrically programmable fuses may be improved.

In an embodiment of the present disclosure, an electrically programmable fuse circuit is provided, including a plurality of fuse cells connected in series, wherein in each of the plurality of fuse cells, one terminal of the fuse cell is connected with a first programming terminal corresponding to the fuse cell, and the other terminal of the fuse cell is connected with a second programming terminal corresponding to the fuse cell via a transistor.

In some embodiments, transistors corresponding to the plurality of fuse cells are controlled to be turned on or turned off by a same voltage.

In some embodiments, the transistor corresponding to each of the plurality of fuse cells is controlled to be turned on or turned off by a gate control voltage corresponding to the transistor.

In some embodiments, adjacent two fuse cells share the same first programming terminal, or share the same second programming terminal.

In some embodiments, the adjacent two fuse cells sharing the same second programming terminal are connected with the second programming terminal via the same transistor.

In some embodiments, the first programming terminal corresponding to the fuse cell is configured to receive a power voltage, and the second programming terminal corresponding to the fuse cell is grounded.

In an embodiment of the present disclosure, a programming method for electrically programmable fuse is provided, including: applying a power voltage to first programming terminals corresponding to a plurality of fuse cells; and controlling transistors corresponding to the plurality of fuse cells to be turned on, to make a current flow through the fuse cells.

In some embodiments, the power voltage is applied to the first programming terminals corresponding to the plurality of fuse cells simultaneously or according to a sequence indicated by a sequence control signal.

In some embodiments, controlling the transistors corresponding to the plurality of fuse cells to be turned on includes: controlling the transistors corresponding to the plurality of fuse cells to be turned on simultaneously; or controlling the transistors corresponding to the plurality of fuse cells to be turned on according to a sequence indicated by a sequence control signal.

In an embodiment of the present disclosure, a state detection method for electrically programmable fuse, including: disconnecting first programming terminals corresponding to a plurality of fuse cells, and controlling transistors corresponding to the plurality of fuse cells to be turned off; controlling a detection current to flow through the plurality of fuse cells; detecting a total voltage of the plurality of fuse cells connected in series; and determining whether the plurality of fuse cells connected in series are successfully programmed based on the total voltage.

In some embodiments, determining whether the plurality of fuse cells connected in series are successfully programmed based on the total voltage includes: if the total voltage is higher than a predetermined threshold, determining that the plurality of fuse cells connected in series are successfully programmed.

Compared with the existing techniques, embodiments of the present disclosure may have following advantages. In embodiments of the present disclosure, the electrically programmable fuse circuit includes a plurality of fuse cells connected in series. In each of the plurality of fuse cells, one terminal of the fuse cell is connected with a first programming terminal corresponding to the fuse cell, and the other terminal of the fuse cell is connected with a second programming terminal corresponding to the fuse cell via a transistor. Compared with the existing solutions where a failure of a single fuse cell causes a failure of an entire chip, embodiments of the present disclosure may reduce the influence of a failure of a single fuse cell on the entire electrically programmable fuse circuit by including the plurality of fuse cells connected in series in the electrically programmable fuse circuit. That is, even if the single fuse cell fails, the electrically programmable fuse circuit still can operate normally, which ensures reliability of electrically programmable fuses.

Further, adjacent two fuse cells share the same first programming terminal, or share the same second programming terminal. By adjacent two fuse cells sharing the same power voltage or the same transistor, cost of the electrically programmable fuse circuit may be reduced.

DETAILED DESCRIPTION

As described in the background, the test of the electrically programmable fuse is usually the last step in the chip probe. Once the electrically programmable fuse fails, the chip probe will fail and the yield of chips will be reduced.

Figure 1:
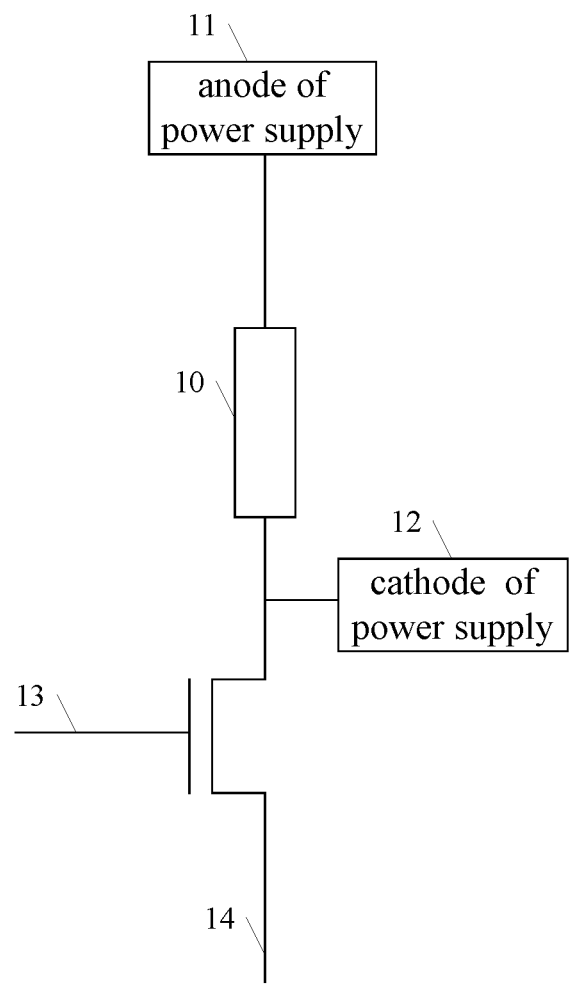
FIG. 1 schematically illustrates a diagram of an electrically programmable fuse circuit in the existing techniques.

Referring to FIG. 1, FIG. 1 schematically illustrates a diagram of an electrically programmable fuse circuit in the existing techniques.

The electrically programmable fuse circuit includes a fuse cell 10. One terminal of the fuse cell 10 is connected with an anode 11 of a power supply, and the other terminal of the fuse cell 10 is connected with a cathode 12 of the power supply and serves as a drain of a transistor which may further include a gate 13 and a source 14.

When programming is performed with the above electrically programmable fuse circuit, once the fuse cell 10 fails, that is, after a metal silicide in the fuse cell is fused, a resistance change of the fuse cell is relatively small, which causes the entire electrically programmable fuse circuit not to be capable of being used.

Compared with the existing solutions where a failure of a single fuse cell causes a failure of an entire chip, embodiments of the present disclosure may reduce the influence of a failure of a single fuse cell on an entire electrically programmable fuse circuit by including a plurality of fuse cells connected in series in the electrically programmable fuse circuit. That is, even if a single fuse cell fails, the electrically programmable fuse circuit still can operate normally, which ensures reliability of electrically programmable fuses.

In order to clarify the objects, characteristics and advantages of the disclosure, embodiments of present disclosure will be described in detail in conjunction with accompanying drawings.

In embodiments of the present disclosure, the electrically programmable fuse circuit includes a plurality of fuse cells connected in series. In each of the plurality of fuse cells, one terminal of the fuse cell is connected with a first programming terminal corresponding to the fuse cell, and the other terminal of the fuse cell is connected with a second programming terminal corresponding to the fuse cell via a transistor.

Figure 2:
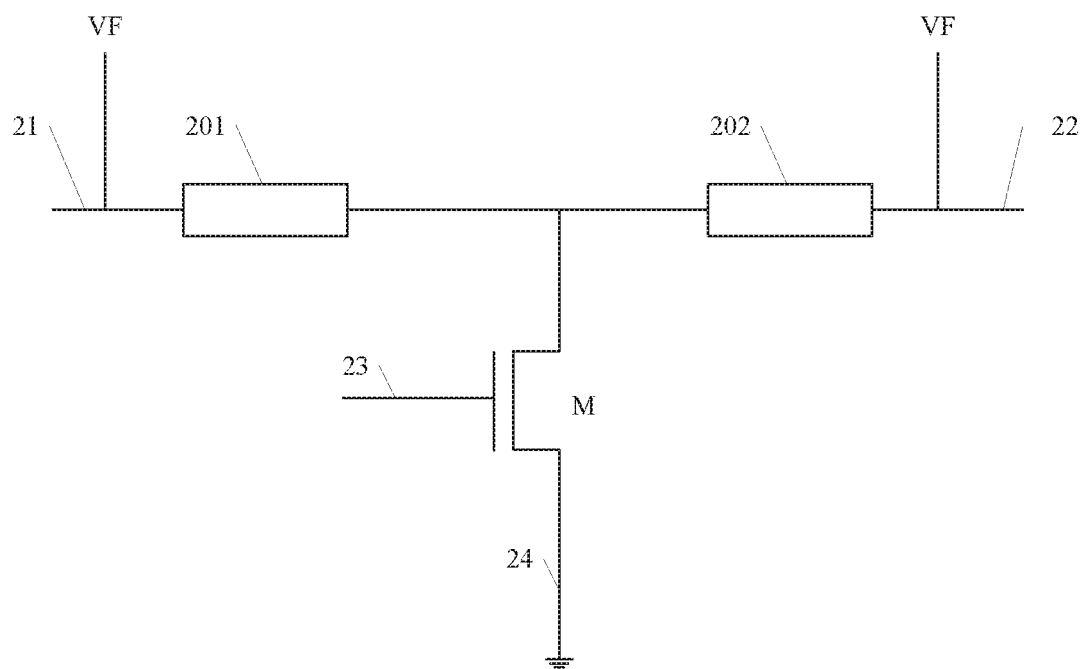
FIG. 2 schematically illustrates a diagram of an electrically programmable fuse circuit according to an embodiment of the present disclosure.

FIG. 2 schematically illustrates a diagram of an electrically programmable fuse circuit according to an embodiment of the present disclosure.

Referring to FIG. 2, the electrically programmable fuse circuit includes a fuse cell 201 and a fuse cell 202 which are connected in series. One terminal of the fuse cell 201 is connected with a first programming terminal corresponding to the fuse cell 201, and the other terminal of the fuse cell 201 is connected with a second programming terminal corresponding to the fuse cell 201 via a transistor M. One terminal of the fuse cell 202 is connected with a first programming terminal corresponding to the fuse cell 202, and the other terminal of the fuse cell 202 is connected with a second programming terminal corresponding to the fuse cell 202 via the transistor M.

Specifically, a drain of the transistor M is connected with one of the two terminals of the fuse cell 201 and one of the two terminals of the fuse cell 202, a gate 23 of the transistor M receives a gate control voltage, and a source 24 of the transistor M is grounded.

In some embodiments, the first programming terminal is configured to receive a power voltage VF, and the second programming terminal is grounded.

In some embodiments, the electrically programmable fuse circuit includes at least two fuse cells connected in series. When one fuse cell fails and the other fuse cell is active (i.e., in a high impedance state), as the fuse cells are connected in series, the electrically programmable fuse circuit is still in the high impedance state, that is, the electrically programmable fuse circuit is still active, thereby reducing the influence of a failure of a single fuse cell on the entire electrically programmable fuse circuit. In this way, the electrically programmable fuse circuit can still operate normally when a single fuse cell fails, which ensures the reliability of electrically programmable fuses.

It should be noted that the number of the fuse cells and the number of the transistors M in the electrically programmable fuse circuit may be determined based on practical application requirements, for example, may be 2, 3 or 4, which is not limited by the embodiment of the present disclosure.

Specifically, still referring to FIG. 2, one terminal 21 of the two fuse cells connected in series may serve as a cathode of the electrically programmable fuse circuit, and the other terminal 22 of the two fuse cells connected in series may serve as an anode of the electrically programmable fuse circuit. Alternatively, one terminal 21 of the two fuse cells connected in series may serve as an anode of the electrically programmable fuse circuit, and the other terminal 22 of the two fuse cells connected in series may serve as a cathode of the electrically programmable fuse circuit.

Specifically, the power voltage VF may be a high voltage higher than a predetermined threshold.

In some embodiments, still referring to FIG. 2, adjacent two fuse cells (i.e., the fuse cell 201 and the fuse cell 202) in the electrically programmable fuse circuit share the transistor M. That is to say, the adjacent two fuse cells shown in FIG. 2 are connected to the drain of the transistor M. Specifically, one terminal of the fuse cell 201 is connected with the first programming terminal corresponding to the fuse cell 201 for receiving the power voltage VF, and the other terminal of the fuse cell 201 is connected with the drain of the transistor M. One terminal of the fuse cell 202 is connected with the drain of the transistor M, and the other terminal of the fuse cell 202 is connected with the first programming terminal corresponding to the fuse cell 202 for receiving the power voltage VF.

Figure 3:
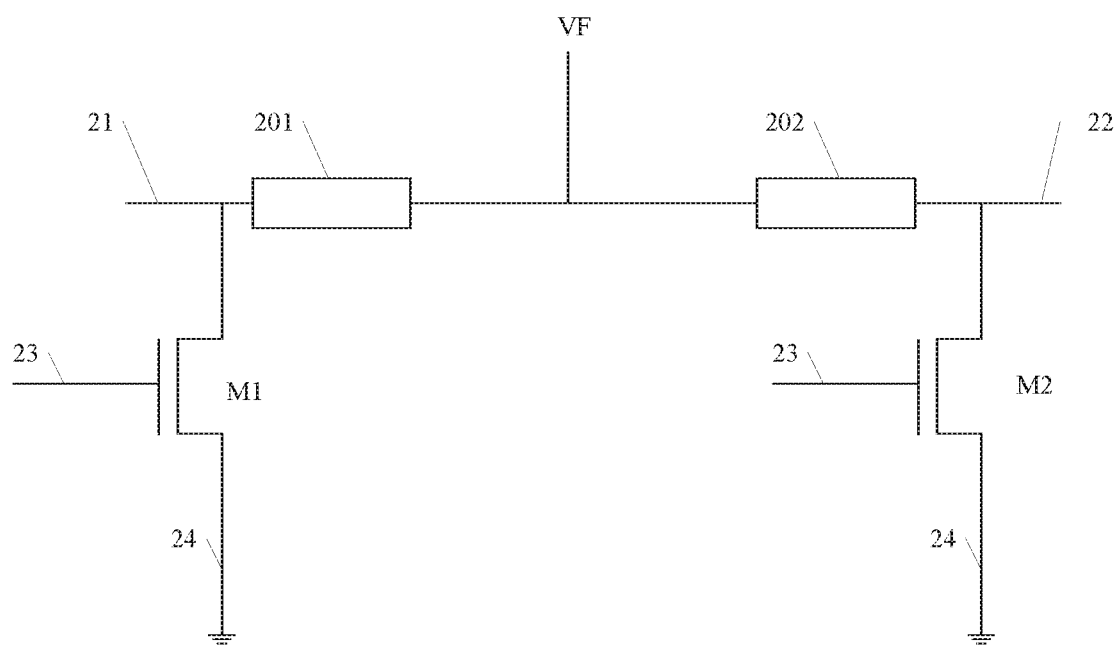
FIG. 3 schematically illustrates a diagram of an electrically programmable fuse circuit according to another embodiment of the present disclosure.

In some embodiments, referring to FIG. 3, adjacent two fuse cells in the electrically programmable fuse circuit share the same first programming terminal.

Different from the embodiment shown in FIG. 2, in the embodiment as shown in FIG. 3, the electrically programmable fuse circuit includes two transistors, that is, a transistor M1 and a transistor M2. Adjacent two fuse cells share the same first programming terminal to receive the same power voltage VF. Specifically, one terminal of the fuse cell 201 is connected with a drain of the transistor M1, and the other terminal of the fuse cell 201 is connected with the first programming terminal corresponding to the fuse cell 201 for receiving the power voltage VF. One terminal of the fuse cell 202 is connected with the first programming terminal corresponding to the fuse cell 202 for receiving the power voltage VF, and the other terminal of the fuse cell 202 is connected with a drain of the transistor M2.

In some embodiments, the transistors corresponding to the plurality of fuse cells are turned on or turned off by a same control voltage.

Specifically, still referring to FIG. 3, when the electrically programmable fuse circuit includes a plurality of transistors (the transistor M1 and the transistor M2), the transistors M1 and M2 are controlled to be turned on or turned off by the same control voltage, that is, a gate 23 of the transistor M1 and a gate 23 of the transistor M2 may receive the same gate control voltage, so that the turn-on and turn-off of the transistors M1 and M2 can be simultaneously controlled by the gate control voltage.

In some embodiments, the transistor corresponding to each of the fuse cells is turned on or off by a gate control voltage corresponding to the transistor.

Specifically, still referring to FIG. 3, the transistor M1 and the transistor M2 are controlled to be turned on or off by their corresponding gate control voltages, that is, the gate 23 of the transistor M1 and the gate 23 of the transistor M2 may respectively receive the gate control voltages. Therefore, the turned-on and turned-off of the transistor M1 and the turned-on and turned-off of the transistor M2 can be separately controlled by corresponding gate control voltages respectively.

In some embodiments, one terminal of each of the fuse cells in the electrically programmable fuse circuit is connected with a same first programming terminal to receive the same power voltage VF at the same time.

Specifically, referring to FIG. 2, one terminal of the fuse cell 201 and one terminal of the fuse cell 202 share the same first programming terminal to receive the same power voltage VF, so that the fuse cell 201 and the fuse cell 202 can be simultaneously programmed via the power voltage VF.

In some embodiments, the first programming terminals corresponding to the fuse cells in the electrically programmable fuse circuit may receive the power voltage VF at different times.

Specifically, still referring to FIG. 2, the first programming terminal connected with one terminal of the fuse cell 201 and the first programming terminal connected with one terminal of the fuse cell 202 can receive the power voltage VF at different times, so that the fuse cells 201 and 202 can be respectively programmed by receiving the power voltage VF at different times.

Figure 4:
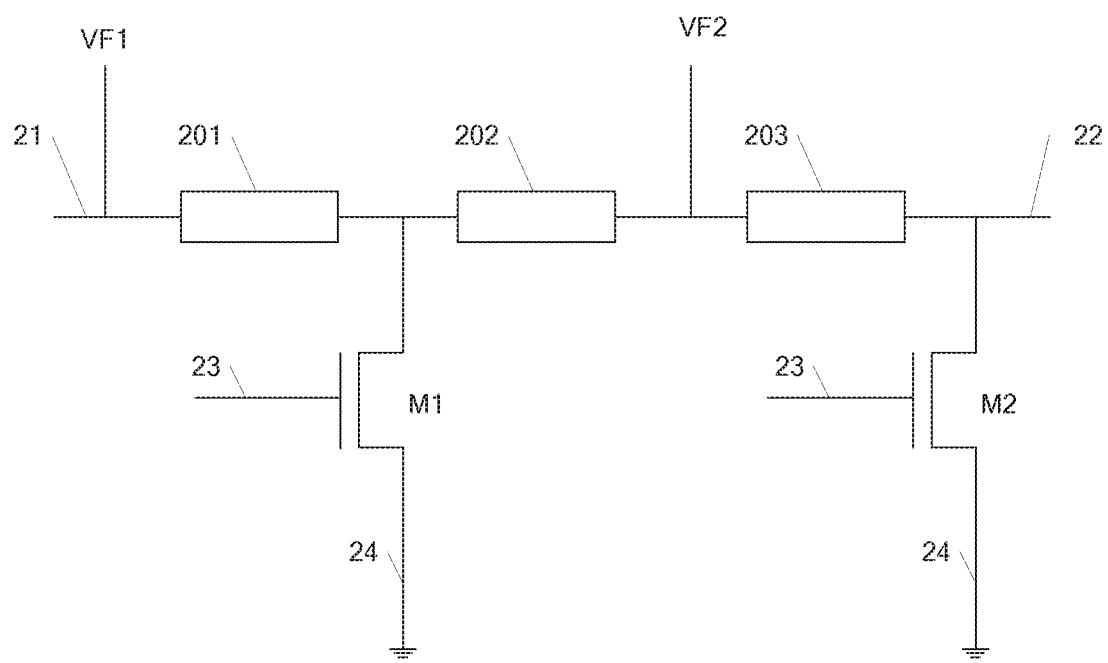
FIGS. 4 to 7 schematically illustrate diagrams of four typical electrically programmable fuse circuits according to embodiments of the present disclosure.
Figure 5:
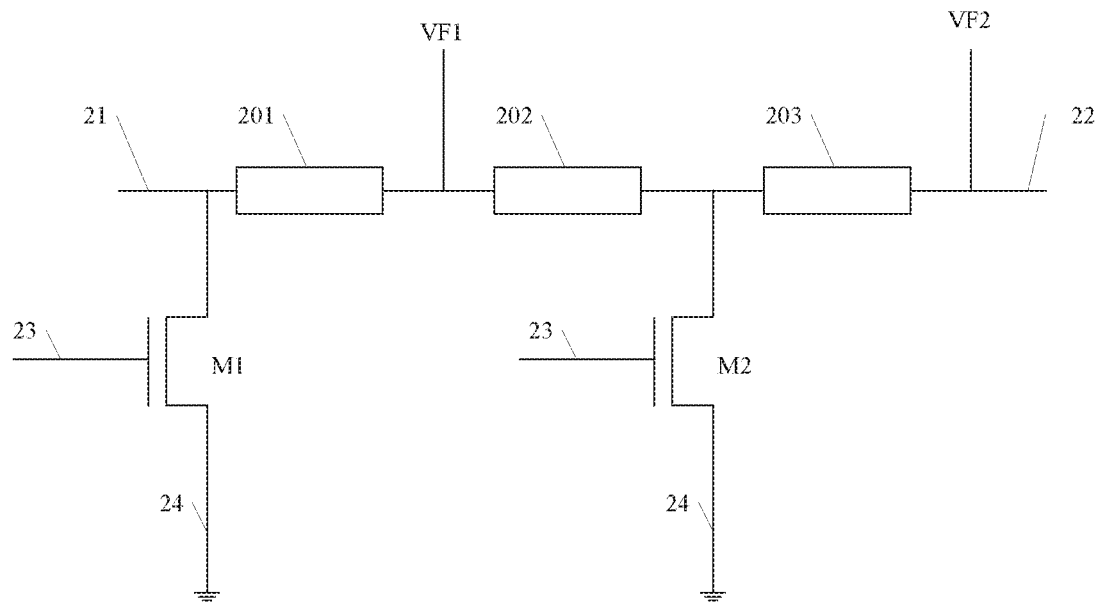

FIGS. 4 and 5 illustrate a scenario in which an electrically programmable fuse circuit includes three fuse cells (i.e., a fuse cell 201, a fuse cell 202 and a fuse cell 203). In the scenario, the electrically programmable fuse circuit includes two transistors (i.e., a transistor M1 and a transistor M2).

Specifically, in the electrically programmable fuse circuit shown in FIG. 4, one terminal of the fuse cell 201 is connected with a first programming terminal corresponding to the fuse cell 201 for receiving the power voltage VF1, and the other terminal of the fuse cell 201 is connected with a drain of the transistor M1. One terminal of the fuse cell 202 is connected with the drain of the transistor M1, and the other terminal of the fuse cell 202 is connected with a first programming terminal corresponding to the fuse cell 202 for receiving the power voltage VF2. One terminal of the fuse cell 203 is connected with a first programming terminal corresponding to the fuse cell 203 for receiving the power voltage VF2, and the other terminal of the fuse cell 203 is connected with a drain of the transistor M2. In other words, the fuse cell 201 and the fuse cell 202 are grounded via the same transistor M1, and the fuse cell 202 and the fuse cell 203 share the same first programming terminal.

Different from the electrically programmable fuse circuit shown in FIG. 4, an electrically programmable fuse circuit shown in FIG. 5 adopts a different connection manner. Specifically, one terminal of the fuse cell 201 is coupled with the drain of the transistor M1, and the other terminal of the fuse cell 201 is connected with the first programming terminal corresponding to the fuse cell 201 for receiving the power voltage VF1. One terminal of the fuse cell 202 is connected with the first programming terminal corresponding to the fuse cell 202 for receiving the power voltage VF1, and the other terminal of the fuse cell 202 is coupled with the drain of the transistor M2. One terminal of the fuse cell 203 is coupled with the drain of the transistor M2, and the other terminal of the fuse cell 203 is connected with the first programming terminal corresponding to the fuse cell 203 for receiving the power voltage VF2. In other words, the fuse cell 201 and the fuse cell 202 share the same first programming terminal, and the fuse cell 202 and the fuse cell 203 are grounded via the same transistor M2.

It should be noted that the power voltage VF1 and the power voltage VF2 may be the same power voltage or different power voltages.

Figure 6:
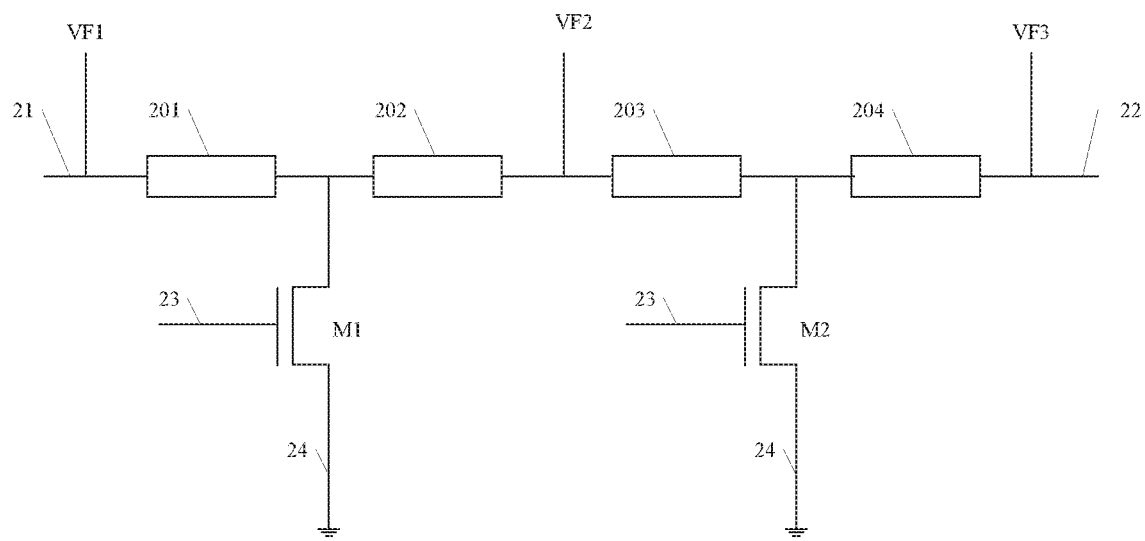
Figure 7:
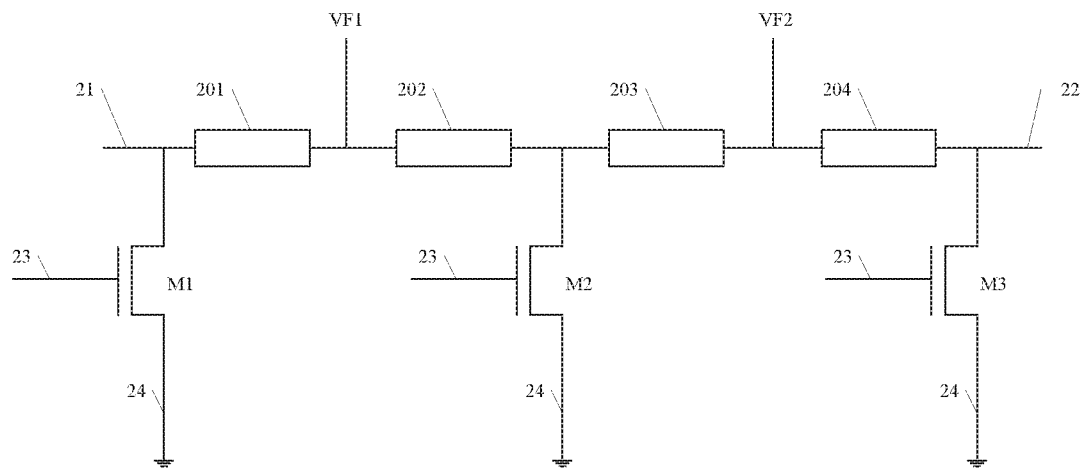

FIGS. 6 and 7 illustrate a scenario in which an electrically programmable fuse circuit includes four fuse cells (i.e., a fuse cell 201, a fuse cell 202, a fuse cell 203 and a fuse cell 204).

Specifically, in the electrically programmable fuse circuit shown in FIG. 6, one terminal of the fuse cell 201 is connected with the first programming terminal corresponding to the fuse cell 201 for receiving the power voltage VF1, and the other terminal of the fuse cell 201 is coupled with the drain of the transistor M1. One terminal of the fuse cell 202 is coupled with the drain of the transistor M1, and the other terminal of the fuse cell 202 is connected with the first programming terminal corresponding to the fuse cell 202 for receiving the power voltage VF2. One terminal of the fuse cell 203 is connected with the first programming terminal corresponding to the fuse cell 203 for receiving the power voltage VF2, and the other terminal of the fuse cell 203 is coupled with the drain of the transistor M2. One terminal of the fuse cell 204 is coupled with the drain of the transistor M2, and the other terminal of the fuse cell 204 is connected with the first programming terminal corresponding to the fuse cell 204 for receiving the power voltage VF3. In other words, the fuse cell 201 and the fuse cell 202 are grounded via the same transistor M1, the fuse cell 202 and the fuse cell 203 share the same first programming terminal, and the fuse cell 203 and the fuse cell 204 are grounded via the same transistor M2.

Different from the electrically programmable fuse circuit shown in FIG. 6, an electrically programmable fuse circuit shown in FIG. 7 adopts a different connection manner. Specifically, one terminal of the fuse cell 201 is coupled with the drain of the transistor M1, and the other terminal of the fuse cell 201 is connected with a first programming terminal corresponding to the fuse cell 201 for receiving the power voltage VF1. One terminal of the fuse cell 202 is connected with a first programming terminal corresponding to the fuse cell 202 for receiving the power voltage VF1, and the other terminal of the fuse cell 202 is coupled with the drain of the transistor M2. One terminal of the fuse cell 203 is coupled with the drain of the transistor M2, and the other terminal of the fuse cell 203 is connected with a first programming terminal corresponding to the fuse cell 203 for receiving the power voltage VF2. One terminal of the fuse cell 204 is connected with a first programming terminal corresponding to the fuse cell 204 for receiving the power voltage VF2, and the other terminal of the fuse cell 204 is coupled with a drain of the transistor M3. In other words, the fuse cell 201 and the fuse cell 202 share the same first programming terminal, the fuse cell 202 and the fuse cell 203 are grounded via the same transistor M2, and the fuse cell 203 and the fuse cell 204 share the same first programming terminal.

It could be understood by those skilled in the art that when an electrically programmable fuse circuit includes five, six or more fuse cells, circuit connection manners can be referred to the foregoing embodiments and are not described in detail here.

Effectiveness of the electrically programmable fuse circuits shown in FIGS. 6 and 7 has been verified by the inventors. Table 1 illustrates resistance of the electrically programmable fuse circuit and each fuse cell in the electrically programmable fuse circuit before and after programming.

TABLE 1

|  | initial resistance | resistance after programming |
|---|---|---|
| fuse cell 201 | 100 | 200000 |
| fuse cell 202 | 100 | 150000 |
| fuse cell 203 | 100 | 100000 |
| fuse cell 204 | 100 | 10000 |
| electrically programmable fuse circuit | 400 | 460000 |

As shown in Table 1, the resistance of the fuse cell 201, the fuse cell 202 and the fuse cell 203 changes for over 1000 times after the programming, which indicates that the fuse cell 201, the fuse cell 202 and the fuse cell 203 are effective. The resistance of the fuse cell 204 changes for 100 times after the programming, and is relatively small, which indicates that the fuse cell 204 is disabled. As the fuse cell 201, the fuse cell 202, the fuse cell 203 and the fuse cell 204 are connected in series in the electrically programmable fuse circuit, the total resistance of the electrically programmable fuse circuit after the programming is 1150 times of that before the programming. That is, the electrically programmable fuse circuit is effective.

Therefore, a failure of a single fuse cell does not affect performance of the entire electrically programmable fuse circuit. That is, even if the single fuse cell fails, the electrically programmable fuse circuit still can operate normally.

Figure 8:
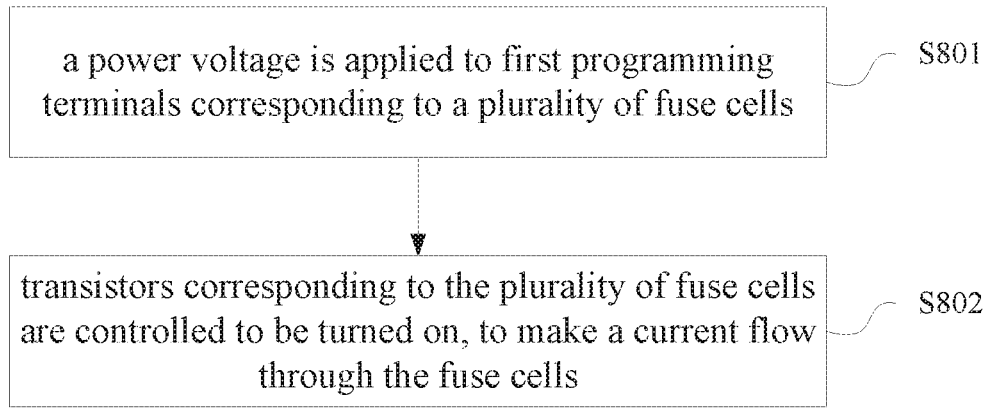
FIG. 8 schematically illustrates a flow chart of a programming method for electrically programmable fuse according to an embodiment of the present disclosure.

In an embodiment of the present disclosure, a programming method for electrically programmable fuse based on an electrically programmable fuse circuit is provided. Referring to FIG. 8, the method includes S801 and S802.

In S801, a power voltage is applied to first programming terminals corresponding to a plurality of fuse cells.

In S802, transistors corresponding to the plurality of fuse cells are controlled to be turned on, to make a current flow through the fuse cells.

In some embodiments, S801 and S802 enable each fuse cell in the electrically programmable fuse circuit and the transistor coupled with the fuse cell to form a loop, so as to fuse a metal silicide in each fuse cell, thereby realizing the programming of the fuse cells.

In some embodiments, the power voltage is applied to the first programming terminals corresponding to the plurality of fuse cells simultaneously, and the transistors corresponding to the plurality of fuse cells are controlled to be turned on simultaneously.

Therefore, in some embodiments, all the fuse cells in the electrically programmable fuse circuit may be programmed simultaneously.

It should be noted that, when the fuse cells in the electrically programmable fuse circuit are programmed simultaneously, a current in the circuit may be relatively high, and accordingly the transistors may have a larger size.

In some embodiments, the power voltage is applied to the first programming terminals corresponding to the plurality of fuse cells according to a sequence indicated by a sequence control signal, and the transistors corresponding to the plurality of fuse cells are controlled to be turned on according to a sequence indicated by a sequence control signal.

In some embodiments, at one time point, only one power voltage is applied to the electrically programmable fuse circuit, and only one gate control voltage is applied to a gate of a transistor, so that at the time point, a metal silicide in a single fuse cell is fused. Therefore, programming of the single fuse cell at the time point can be realized.

In some embodiments, the fuse cells in the electrically programmable fuse circuit may be programmed, respectively.

Figure 9:
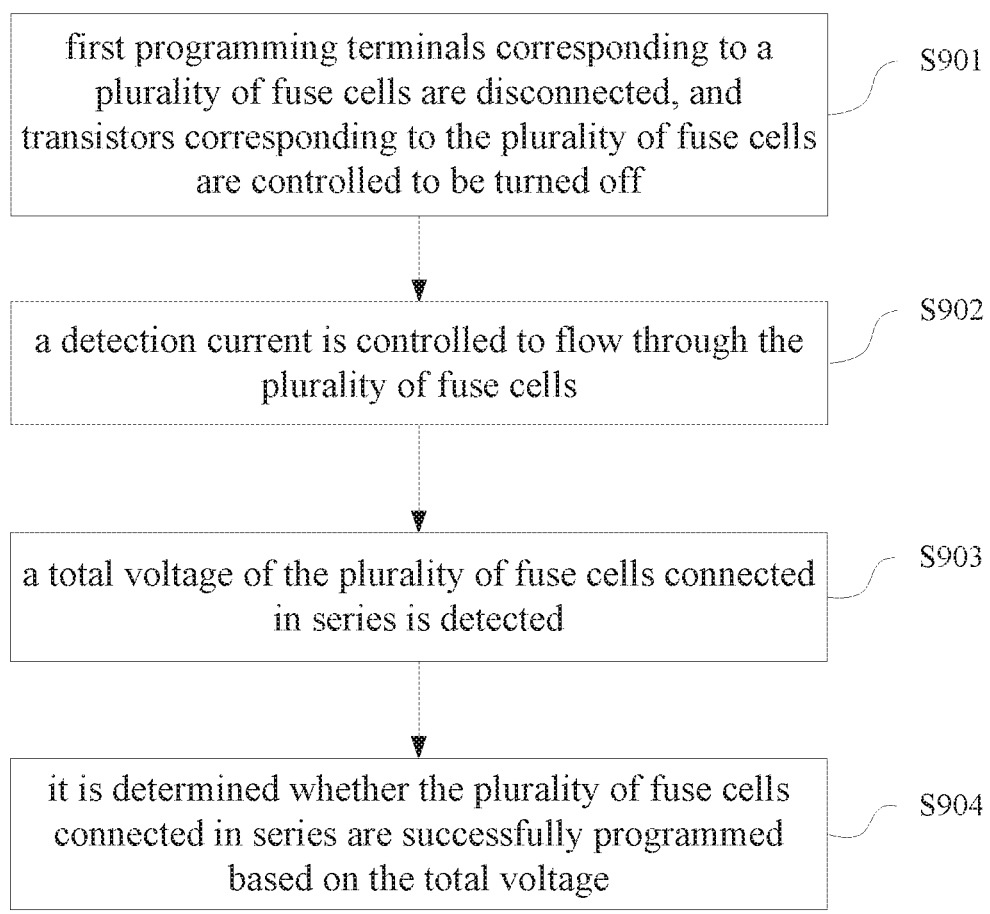
FIG. 9 schematically illustrates a flow chart of a state detection method for electrically programmable fuse according to an embodiment of the present disclosure.

In an embodiment of the present disclosure, a state detection method for electrically programmable fuse. Referring to FIG. 9, the method includes S901 to S904.

In S901, first programming terminals corresponding to a plurality of fuse cells are disconnected, and transistors corresponding to the plurality of fuse cells are controlled to be turned off.

In S902, a detection current is controlled to flow through the plurality of fuse cells.

In S903, a total voltage of the plurality of fuse cells connected in series is detected.

In S904, it is determined whether the plurality of fuse cells connected in series are successfully programmed based on the total voltage.

In some embodiments, resistance of the fuse cell is greater after programming, and a voltage across two terminals of the fuse cell is higher after a current is applied. Therefore, by applying a current to the electrically programmable fuse circuit and detecting the total voltage of the plurality of fuse cells connected in series, a state of the electrically programmable fuse circuit may be detected.

In some embodiments, if the total voltage is lower than a predetermined threshold, it is determined that the plurality of fuse cells connected in series are in a non-high impedance state, i.e., are not successfully programmed.

In some embodiments, if a voltage across two terminals of a single fuse cell is higher than a predetermined threshold, it is determined that a state of the fuse cell corresponds to a first bit which indicates that the fuse cell is successfully programmed, i.e., the fuse cell is in a high impedance state.

In some embodiments, a state of each fuse cell may be represented by a bit, for example, "1" indicates a high impedance state, and "0" indicates a non-high impedance state. Then, the states of the plurality of fuse cells connected in series may be a bit string each bit of which corresponds to a state of one fuse cell, and the number of bits in the bit string is the same as the number of the fuse cells in the electrically programmable fuse circuit.

Specifically, when the fuse cell is in the high impedance state, it indicates that the fuse cell cannot be programmed. When the fuse cell is in the non-high impedance state, it indicates that the fuse cell can be programmed.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. An electrically programmable fuse circuit, comprising:
a plurality of fuse cells connected in series,
wherein in each of the plurality of fuse cells, one terminal of the fuse cell is directly connected with a first programming terminal corresponding to the fuse cell, and the other terminal of the fuse cell is connected with a second programming terminal corresponding to the fuse cell via a transistor, wherein the first programming terminal corresponding to the fuse cell is configured to receive a power voltage.

2. The electrically programmable fuse circuit according to claim 1, wherein at least one transistor corresponding to the plurality of fuse cells are controlled to be turned on or turned off by a same voltage.

3. The electrically programmable fuse circuit according to claim 1, wherein the transistor corresponding to each of the plurality of fuse cells is controlled to be turned on or turned off by a gate control voltage corresponding to the transistor.

4. The electrically programmable fuse circuit according to claim 1, wherein adjacent two fuse cells share the same first programming terminal, or share the same second programming terminal.

5. The electrically programmable fuse circuit according to claim 4, wherein the adjacent two fuse cells sharing the same second programming terminal are connected with the second programming terminal via the same transistor.

6. The electrically programmable fuse circuit according to claim 1, wherein the second programming terminal corresponding to the fuse cell is grounded.

7. The electrically programmable fuse circuit according to claim 2, wherein the second programming terminal corresponding to the fuse cell is grounded.

8. The electrically programmable fuse circuit according to claim 3, wherein the second programming terminal corresponding to the fuse cell is grounded.

9. The electrically programmable fuse circuit according to claim 4, wherein the second programming terminal corresponding to the fuse cell is grounded.

10. The electrically programmable fuse circuit according to claim 5, wherein the second programming terminal corresponding to the fuse cell is grounded.

11. A programming method for electrically programmable fuse, comprising:
applying a power voltage to first programming terminals corresponding to a plurality of fuse cells, wherein the plurality of fuse cells are connected in series, wherein, in each of the plurality of fuse cells, one terminal of the fuse cell is directly connected with the first programming terminal corresponding to the fuse cell, and the other terminal of the fuse cell is connected with a second programming terminal corresponding to the fuse cell via a transistor, and wherein the first programming terminal corresponding to the fuse cell is configured to receive the power voltage; and
controlling at least one transistor corresponding to the plurality of fuse cells to be turned on, to make a current flow through the fuse cells.

12. The method according to claim 11, wherein the power voltage is applied to the first programming terminals corresponding to the plurality of fuse cells simultaneously or according to a sequence indicated by a sequence control signal.

13. The method according to claim 11, wherein controlling the at least one transistor corresponding to the plurality of fuse cells to be turned on comprises:
controlling the at least one transistor corresponding to the plurality of fuse cells to be turned on simultaneously; or
controlling the at least one transistor corresponding to the plurality of fuse cells to be turned on according to a sequence indicated by a sequence control signal.

14. A state detection method for electrically programmable fuse, comprising:
disconnecting first programming terminals corresponding to a plurality of fuse cells, and controlling the at least one transistor corresponding to the plurality of fuse cells to be turned off, wherein the plurality of fuse cells are connected in series, wherein, in each of the plurality of fuse cells, one terminal of the fuse cell is directly connected with the first programming terminal corresponding to the fuse cell, and the other terminal of the fuse cell is connected with a second programming terminal corresponding to the fuse cell via a transistor, and wherein the first programming terminal corresponding to the fuse cell is configured to receive a power voltage;
controlling a detection current to flow through the plurality of fuse cells;
detecting a total voltage of the plurality of fuse cells connected in series; and
determining whether the plurality of fuse cells connected in series are successfully programmed based on the total voltage.

15. The method according to claim 14, wherein determining whether the plurality of fuse cells connected in series are successfully programmed based on the total voltage comprises:
if the total voltage is higher than a predetermined threshold, determining that the plurality of fuse cells connected in series are successfully programmed.

* * * * *